United States Patent
Conkie et al.

(10) Patent No.: US 11,049,491 B2
(45) Date of Patent: *Jun. 29, 2021

(54) SYSTEM AND METHOD FOR PROSODICALLY MODIFIED UNIT SELECTION DATABASES

(71) Applicant: AT&T Intellectual Property I, L.P., Atlanta, GA (US)

(72) Inventors: Alistair D. Conkie, Morristown, NJ (US); Ladan Golipour, Morristown, NJ (US); Ann K. Syrdal, Morristown, NJ (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/828,070

(22) Filed: Mar. 24, 2020

(65) Prior Publication Data

US 2020/0227023 A1    Jul. 16, 2020

Related U.S. Application Data

(63) Continuation of application No. 16/369,882, filed on Mar. 29, 2019, now Pat. No. 10,607,594, which is a
(Continued)

(51) Int. Cl.
*G10L 13/08* (2013.01)
*G10L 13/06* (2013.01)
(Continued)

(52) U.S. Cl.
CPC .............. *G10L 13/06* (2013.01); *G10L 15/02* (2013.01); *G10L 15/063* (2013.01);
(Continued)

(58) Field of Classification Search
CPC .............................. G10L 13/027; G10L 13/08
See application file for complete search history.

(56) References Cited

U.S. PATENT DOCUMENTS 5,696,879 A * 12/1997 Cline ...................... G10L 19/00
704/260
5,913,193 A * 6/1999 Huang .................... G10L 13/07
704/256

(Continued)

OTHER PUBLICATIONS

Golipour et al., "Prosodically Modifying Speech for Unit Selection Speech Synthesis Databases," 8th ISCA Speech Synthesis Workshop, Aug. 31-Sep. 2, 2013, Barcelona, Spain.

*Primary Examiner* — Shreyans A Patel

(57) ABSTRACT

Systems, methods, and computer-readable storage devices to improve the quality of synthetic speech generation. A system selects speech units from a speech unit database, the speech units corresponding to text to be converted to speech. The system identifies a desired prosodic curve of speech produced from the selected speech units, and also identifies an actual prosodic curve of the speech units. The selected speech units are modified such that a new prosodic curve of the modified speech units matches the desired prosodic curve. The system stores the modified speech units into the speech unit database for use in generating future speech, thereby increasing the prosodic coverage of the database with the expectation of improving the output quality.

20 Claims, 5 Drawing Sheets

Related U.S. Application Data continuation of application No. 16/004,812, filed on Jun. 11, 2018, now Pat. No. 10,249,290, which is a continuation of application No. 14/275,349, filed on May 12, 2014, now Pat. No. 9,997,154.

(51) Int. Cl.

| | | |
|---|---|---|
| *G11C 7/16* | (2006.01) | |
| *G10L 15/06* | (2013.01) | |
| *G10L 15/02* | (2006.01) | |
| *G10L 21/003* | (2013.01) | |
| *G10L 25/90* | (2013.01) | |

(52) U.S. Cl.
CPC ............ *G10L 21/003* (2013.01); *G10L 25/90* (2013.01); *G11C 7/16* (2013.01); *G10L 2015/0635* (2013.01)

(56) References Cited

U.S. PATENT DOCUMENTS

| | | | | |
|---|---|---|---|---|
| 6,240,384 B1* | 5/2001 | Kagoshima | ............ | G10L 13/07 704/220 |
| 6,405,169 B1* | 6/2002 | Kondo | ............ | G10L 13/08 704/258 |
| 6,823,309 B1* | 11/2004 | Kato | ............ | G10L 13/10 704/267 |
| 7,280,969 B2* | 10/2007 | Eide | ............ | G10L 13/033 704/268 |
| 7,567,896 B2* | 7/2009 | Coorman | ............ | G10L 13/06 704/10 |
| 7,801,725 B2* | 9/2010 | Chen | ............ | G10L 25/69 704/207 |
| 7,979,274 B2* | 7/2011 | DeSimone | ............ | G10L 13/10 704/226 |
| 8,219,398 B2 | 7/2012 | Marple et al. | | |
| 8,321,225 B1* | 11/2012 | Jansche | ............ | G10L 13/10 704/263 |
| 8,370,149 B2* | 2/2013 | Tachibana | ............ | G10L 13/10 704/260 |
| 8,494,856 B2* | 7/2013 | Latorre | ............ | G10L 13/10 704/260 |
| 9,093,067 B1 | 7/2015 | Jansche | | |
| 10,249,290 B2* | 4/2019 | Conkie | ............ | G10L 13/06 |
| 2001/0032079 A1* | 10/2001 | Okutani | ............ | G10L 13/07 704/258 |
| 2003/0101051 A1* | 5/2003 | Raj | ............ | G10L 15/02 704/219 |
| 2003/0115049 A1* | 6/2003 | Beutnagel | ............ | G10L 13/07 704/220 |
| 2006/0259303 A1* | 11/2006 | Bakis | ............ | G10L 13/10 704/268 |
| 2007/0233472 A1* | 10/2007 | Sinder | ............ | G10L 21/003 704/219 |
| 2007/0271099 A1* | 11/2007 | Kagoshima | ............ | G10L 13/047 704/258 |
| 2008/0177548 A1* | 7/2008 | Yamada | ............ | G10L 13/10 704/260 |
| 2008/0195391 A1* | 8/2008 | Marple | ............ | G10L 13/10 704/260 |
| 2009/0048844 A1* | 2/2009 | Morinaka | ............ | G10L 13/07 704/267 |
| 2009/0254349 A1 | 10/2009 | Hirose et al. | | |
| 2010/0131267 A1* | 5/2010 | Silbert | ............ | G10L 13/07 704/10 |
| 2012/0072208 A1* | 3/2012 | Krishnan | ............ | G10L 19/097 704/207 |
| 2013/0066632 A1* | 3/2013 | Conkie | ............ | G10L 13/10 704/260 |

\* cited by examiner

SYSTEM AND METHOD FOR PROSODICALLY MODIFIED UNIT SELECTION DATABASES

PRIORITY INFORMATION

The present application is a continuation of U.S. patent application Ser. No. 16/369,882, which is a continuation of U.S. patent application Ser. No. 16/004,812, filed Jun. 11, 2018, now U.S. Pat. No. 10,249,290, which is a continuation of U.S. patent application Ser. No. 14/275,349, filed May 12, 2014, now U.S. Pat. No. 9,997,154, issued Jun. 12, 2018, the content of which are incorporated herein by reference in their entirety.

BACKGROUND

1. Technical Field

The present disclosure relates to improving the quality of a speech unit selection database and more specifically to modifying parts of the speech unit selection database, then adding the modified speech units back into the database for use in future speech generation.

2. Introduction

Speech unit selection synthesis can generate very natural audio output but cannot be relied upon to produce consistently good audio output. For example, the quality of the speech produced depends highly on the size and quality of the database of speech samples being used. To improve quality, speech selection synthesis can use domain-specific databases of speech samples, such that in-domain text for a domain-specific database produces high-quality speech, but resulting in out-of-domain text producing poor quality speech. Previous techniques tend to focus on the segmental level, or repurposing data from other voices/databases to boost the effective size of a database.

DETAILED DESCRIPTION

Figure 1:
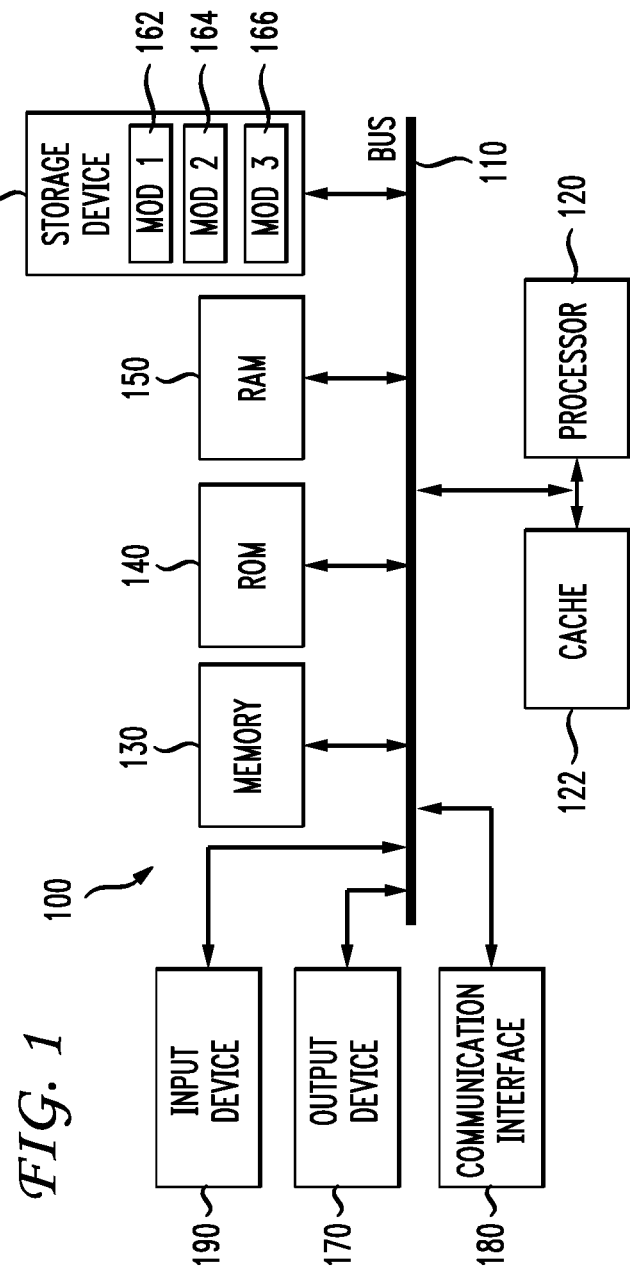
FIG. 1 illustrates an example system embodiment.

A system, method and computer-readable storage devices are disclosed which select speech units from a speech unit database, the speech units corresponding to text to be converted to speech. Prior techniques do not perform prosody modification, and therefore at times a desired prosodic contour for a synthetic sentence will be unavailable and substituted by a less satisfactory sequence of units. According to this disclosure, a system identifies a desired prosodic curve of speech produced from selected speech units and also identifies an actual prosodic curve of the speech units. The selected speech units are modified such that a new prosodic curve of the modified speech units matches the desired prosodic curve. The system stores the modified speech units into the speech unit database for use in generating future speech, thereby increasing the prosodic coverage of the database with the expectation of improving the output quality.

By adding extra data to the speech units database, where the extra data is based on data already in the database but has been transformed using signal processing to have a different prosodic realization, the database is augmented and the prosodic coverage of the database increases, thereby maintaining or increasing the quality of the resulting speech. One challenge is performing the augmentation without introducing artifacts into the speech units or into the generated speech resulting from the modified speech units. This challenge can be met by selecting effective signal processing techniques. Exemplary signal processing techniques include Residual-excited Linear Prediction (RELP) and Pitch Synchronous Overlap and Add (PSOLA), which can be used alone or with other signal processing techniques (both in series or in parallel).

The signal processing can transform the existing speech units such that they have a distinct prosodic realization than previously available. Distinct tasks may require distinct forms of signal processing, where the specific attributes of the signal processing in combination with a desired prosodic curve determine which signal processing technique is used. For example, signal processing techniques can require various amounts of processing time, power, and other logistics to provide various results (i.e., how the speech units are modified and how the curves are output) which may be more desirable in certain cases and less desirable in other instances.

The first task to be able to generate new prosody from existing utterances. To achieve this, a database is constructed having many speech units. Consider the example of a database having speech units recorded from a female speaker speaking American English, where the woman's speech units are part of a larger collection of speech units. The audio files are 16 kHz, 16 bit audio. The prosody dataset is composed of approximately 2100 sentence pairs of the form "Calling Robert Kerr" (a declarative example) and "Was that Robert Kerr?" (an interrogative example). Each pair (the declarative example and the interrogative example) uses a different combination of first name and last name, with one example from each pair of examples has a declarative intonation and/or a yes/no interrogative intonation. Having a more complete sentence context allows the system to produce a more natural pitch pattern compared to when the speaker pronounces only the names in a statement or question form.

The first and last names are extracted from the prosody dataset based on their transcriptions. The extracted names are categorized based on their syllable stress pattern. For example, stressed and non-stressed syllables are marked with "1" and "0", respectively. From these stress patterns, stress-pattern classes are developed. The amount of stress pattern classes can be based on pattern recognition, an amount of processing power available, a level of complexity desired (which may be determined based on the processing power, or may be predetermined by a system user), and/or the amount of stress pattern data available. As an example, 10 stress pattern classes may be identified.

Target prosody templates are trained and prosody hypotheses are generated, which together can be used to compare modified speech to a desired stress pattern class. For example, speech units having a first prosodic curve can be identified as not having a desired prosodic curve. A target prosodic curve can be selected, at which point the system modifies the existing stresses of the speech units to match and/or mirror the stresses of the target prosodic curve. When those stresses are within a threshold distance of the target prosodic curve, the modified speech units can be saved/added to a speech unit database. Alternatively, instead of modifying the set of speech units selected, multiple prosody hypotheses can be made from the selected speech units, where each prosody hypothesis represents a modification of the speech units. After generating the various prosody hypotheses, the system compares the prosody hypotheses, selecting the version closest to the target prosody template as the desired hypothesis. The desired hypothesis will then be saved and added to the speech database.

Various embodiments of the disclosure are described in detail below. While specific implementations are described, it should be understood that this is done for illustration purposes only. Other components and configurations may be used without parting from the spirit and scope of the disclosure.

A brief description of a basic general purpose system or computing device in FIG. 1 which can be employed to practice the concepts, methods, and techniques disclosed is illustrated. A more detailed description of identifying, modifying, and storing prosodic curves will then follow.

With reference to FIG. 1, an exemplary system and/or computing device 100 includes a processing unit (CPU or processor) 120 and a system bus 110 that couples various system components including the system memory 130 such as read only memory (ROM) 140 and random access memory (RAM) 150 to the processor 120. The system 100 can include a cache 122 of high-speed memory connected directly with, in close proximity to, or integrated as part of the processor 120. The system 100 copies data from the memory 130 and/or the storage device 160 to the cache 122 for quick access by the processor 120. In this way, the cache provides a performance boost that avoids processor 120 delays while waiting for data. These and other modules can control or be configured to control the processor 120 to perform various operations or actions. Other system memory 130 may be available for use as well. The memory 130 can include multiple different types of memory with different performance characteristics. It can be appreciated that the disclosure may operate on a computing device 100 with more than one processor 120 or on a group or cluster of computing devices networked together to provide greater processing capability. The processor 120 can include any general purpose processor and a hardware module or software module, such as module 1 162, module 2 164, and module 3 166 stored in storage device 160, configured to control the processor 120 as well as a special-purpose processor where software instructions are incorporated into the processor. The processor 120 may be a self-contained computing system, containing multiple cores or processors, a bus, memory controller, cache, etc. A multi-core processor may be symmetric or asymmetric. The processor 120 can include multiple processors, such as a system having multiple, physically separate processors in different sockets, or a system having multiple processor cores on a single physical chip. Similarly, the processor 120 can include multiple distributed processors located in multiple separate computing devices, but working together such as via a communications network. Multiple processors or processor cores can share resources such as memory 130 or the cache 122, or can operate using independent resources. The processor 120 can include one or more of a state machine, an application specific integrated circuit (ASIC), or a programmable gate array (PGA) including a field PGA.

The system bus 110 may be any of several types of bus structures including a memory bus or memory controller, a peripheral bus, and a local bus using any of a variety of bus architectures. A basic input/output (BIOS) stored in ROM 140 or the like, may provide the basic routine that helps to transfer information between elements within the computing device 100, such as during start-up. The computing device 100 further includes storage devices 160 or computer-readable storage media such as a hard disk drive, a magnetic disk drive, an optical disk drive, tape drive, solid-state drive, RAM drive, removable storage devices, a redundant array of inexpensive disks (RAID), hybrid storage device, or the like. The storage device 160 can include software modules 162, 164, 166 for controlling the processor 120. The system 100 can include other hardware or software modules. The storage device 160 is connected to the system bus 110 by a drive interface. The drives and the associated computer-readable storage devices provide nonvolatile storage of computer-readable instructions, data structures, program modules and other data for the computing device 100. In one aspect, a hardware module that performs a particular function includes the software component stored in a tangible computer-readable storage device in connection with the necessary hardware components, such as the processor 120, bus 110, display 170, and so forth, to carry out a particular function. In another aspect, the system can use a processor and computer-readable storage device to store instructions which, when executed by the processor, cause the processor to perform operations, a method or other specific actions. The basic components and appropriate variations can be modified depending on the type of device, such as whether the device 100 is a small, handheld computing device, a desktop computer, or a computer server. When the processor 120 executes instructions to perform "operations", the processor 120 can perform the operations directly and/or facilitate, direct, or cooperate with another device or component to perform the operations.

Although the exemplary embodiment(s) described herein employs the hard disk 160, other types of computer-readable storage devices which can store data that are accessible by a computer, such as magnetic cassettes, flash memory cards, digital versatile disks (DVDs), cartridges, random access memories (RAMs) 150, read only memory (ROM) 140, a cable containing a bit stream and the like, may also be used in the exemplary operating environment. Tangible computer-readable storage media, computer-readable storage devices, or computer-readable memory devices, expressly exclude media such as transitory waves, energy, carrier signals, electromagnetic waves, and signals per se.

To enable user interaction with the computing device 100, an input device 190 represents any number of input mechanisms, such as a microphone for speech, a touch-sensitive screen for gesture or graphical input, keyboard, mouse, motion input, speech and so forth. An output device 170 can also be one or more of a number of output mechanisms known to those of skill in the art. In some instances, multimodal systems enable a user to provide multiple types of input to communicate with the computing device 100. The communications interface 180 generally governs and manages the user input and system output. There is no restriction on operating on any particular hardware arrangement and therefore the basic hardware depicted may easily be substituted for improved hardware or firmware arrangements as they are developed.

For clarity of explanation, the illustrative system embodiment is presented as including individual functional blocks including functional blocks labeled as a "processor" or processor 120. The functions these blocks represent may be provided through the use of either shared or dedicated hardware, including, but not limited to, hardware capable of executing software and hardware, such as a processor 120, that is purpose-built to operate as an equivalent to software executing on a general purpose processor. For example the functions of one or more processors presented in FIG. 1 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) 140 for storing software performing the operations described below, and random access memory (RAM) 150 for storing results. Very large scale integration (VLSI) hardware embodiments, as well as custom VLSI circuitry in combination with a general purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system 100 shown in FIG. 1 can practice all or part of the recited methods, can be a part of the recited systems, and/or can operate according to instructions in the recited tangible computer-readable storage devices. Such logical operations can be implemented as modules configured to control the processor 120 to perform particular functions according to the programming of the module. For example, FIG. 1 illustrates three modules Mod1 162, Mod2 164 and Mod3 166 which are modules configured to control the processor 120. These modules may be stored on the storage device 160 and loaded into RAM 150 or memory 130 at runtime or may be stored in other computer-readable memory locations.

One or more parts of the example computing device 100, up to and including the entire computing device 100, can be virtualized. For example, a virtual processor can be a software object that executes according to a particular instruction set, even when a physical processor of the same type as the virtual processor is unavailable. A virtualization layer or a virtual "host" can enable virtualized components of one or more different computing devices or device types by translating virtualized operations to actual operations. Ultimately however, virtualized hardware of every type is implemented or executed by some underlying physical hardware. Thus, a virtualization compute layer can operate on top of a physical compute layer. The virtualization compute layer can include one or more of a virtual machine, an overlay network, a hypervisor, virtual switching, and any other virtualization application.

The processor 120 can include all types of processors disclosed herein, including a virtual processor. However, when referring to a virtual processor, the processor 120 includes the software components associated with executing the virtual processor in a virtualization layer and underlying hardware necessary to execute the virtualization layer. The system 100 can include a physical or virtual processor 120 that receive instructions stored in a computer-readable storage device, which cause the processor 120 to perform certain operations. When referring to a virtual processor 120, the system also includes the underlying physical hardware executing the virtual processor 120.

Figure 2:
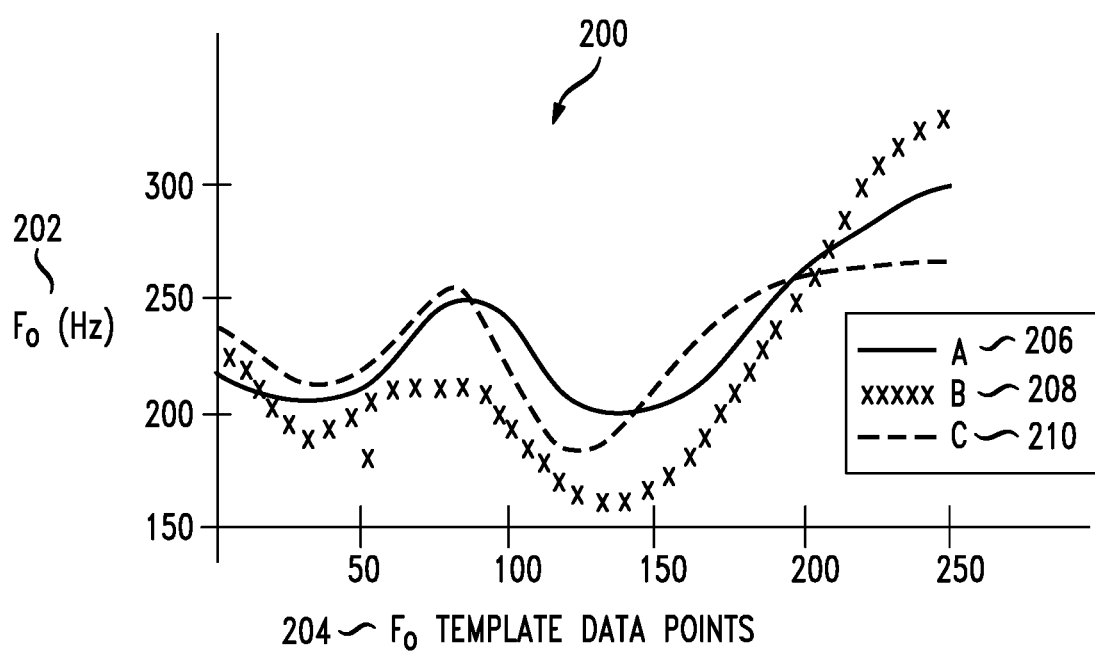
FIG. 2 illustrates pitch contour templates.

Having disclosed some components of a computing system, the disclosure now turns to FIG. 2, which illustrates pitch contour templates 200 for three different distinct stress patterns 206, 208, 210. Each pitch contour is measured in by the fundamental frequency $F_o$ 202 and the fundamental frequency $F_o$ template data points 204. The system will identify the prosodic curve of the speech units for a word being generated, then compare the prosodic curve to the prosodic curves of a desired intonation, accent, or other desired characteristic. Following the comparison, the selected speech units will be modified to more closely resemble the desired prosodic curve, at which time the modified speech units will be stored.

Consider if the system were to select speech units corresponding to line A 206. The selected speech units have an overall length, which can be in units of time or datapoints, and frequencies corresponding to the fundamental frequencies 202 illustrated. However, both the illustrated frequency $F_o$ 202 and the illustrated fundamental frequency $F_o$ template data points 204 are for illustration only, and can have additional and/or different frequencies from those listed, as well as more or less data points from those illustrated.

The system has speech templates corresponding to alternative intonations B 208 and C 210, and determines the selected speech units A 206 should be modified to more closely match the prosodic curve of intonation B 208. The system can "stretch" or "shrink" the template data via interpolation or sampling, depending on the size of the template in comparison to the size of the sampled speech units A. The $F_o$ template data points 204 can be in the form of time, data points, syllables, or other quantitative measurement relative to the overall expression. As an example of stretching the template, if a selected word to be generated will have a duration of 500 ms and a desired template 208 has a length of 250 ms, the template can be extended to a length of 500 ms. Such extension can require the addition of data points, temporarily or permanently, to the template. Alternatively, the modified template can be saved in addition to the original template.

When extending and shrinking the template, the system can perform an analysis to ensure the extended/shrunken template will provide the desired alternative. As an alternative to extension or shortening of the template, the system can have many templates of varying lengths, varying density of data points, and varying frequency ranges, from which the templates can be selected. Modified templates can be added to the set of templates for use in future selection.

The shape of the pitch contours largely depends on the stress patterns of the word/name(s) being synthesized. Different words or names with similar stress patterns have similar pitch contours. The interrogative training examples can be categorized according to their stress pattern, with an estimated average pitch contour established for each category. To estimate the average pitch contour for each stress category, the system can generate a pitch mark for all interrogative training examples using a Residual-Excited Linear Prediction (RELP) algorithm and form a pitch vector from pitch duration values.

In both configurations, each set of selected speech units has an estimated template pitch contour determined for the interrogative form. The system can rank the pitch vectors of each stress category based on their length and choose the median pitch vector as the class's reference pitch vector. Dynamic time warping can be applied on all pitch vectors in order to align them with the reference pitch vector. The mean of the aligned pitch vectors is computed, which is not a smooth representation of a pitch template contour due to spontaneous errors in the pitch marks and the dynamic time warping performance. The system then performs one dimensional median filtering on the mean pitch vector to generate a smooth pitch template contour, and in this way an interrogative pitch contour for every stress-pattern is generated.

Figure 3:
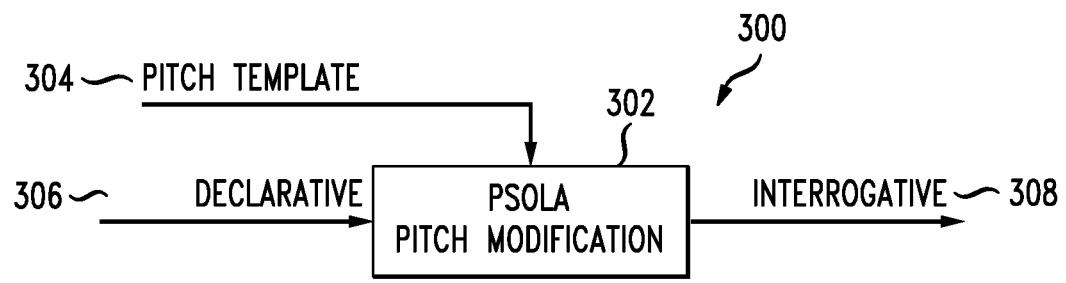
FIG. 3 illustrates a Pitch Synchronous Overlap and Add (PSOLA) conversion.

FIG. 3 illustrates a Pitch Synchronous Overlap and Add (PSOLA) conversion 300. In this example, the speech units selected have a declarative intonation 306. The speech units having the declarative intonation 306 and a pitch template 304 for a desired intonation are inputs for a PSOLA pitch modification algorithm 302, resulting in output speech units having an interrogative 308 intonation. The interrogative pitch contour can be represented as a vector of pitch values.

As stated above, interpolation can be needed on the pitch template 304 such that the summation of all pitch values in the final pitch vector is approximately equal to the length of the selected speech units. Next, the system aligns the first pitch mark of the pitch template 304 with the first pitch mark of the selected speech units 306. With the aligned template and speech units, PSOLA is used to modify the pitch of the selected speech units. However, in certain instances when converting from declarative statements to question (interrogative) form, a large change in pitch value can be present, particularly in the final syllables, for which PSOLA is not ideal. In such instances the system can use a RELP approach.

Figure 4:
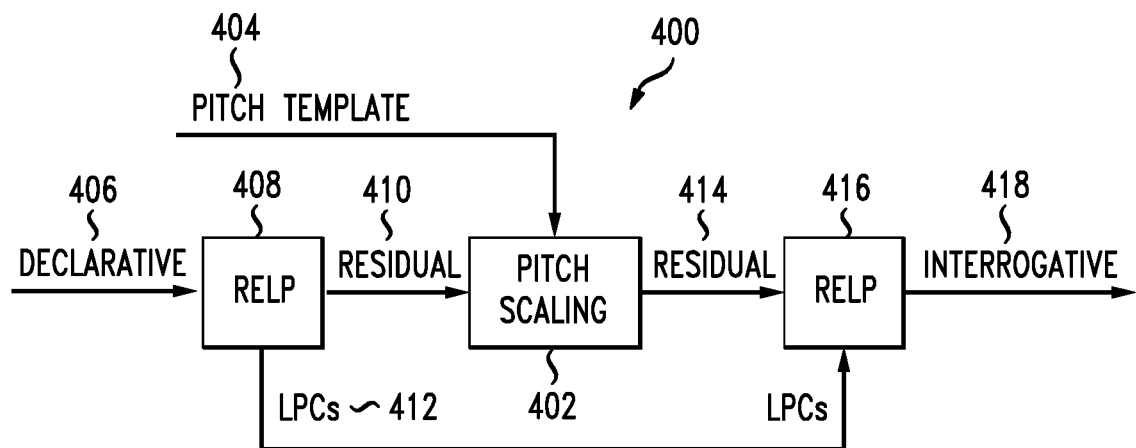
FIG. 4 illustrates a Residual-Excited Linear Prediction (RELP) conversion.

FIG. 4 illustrates a Residual-Excited Linear Prediction (RELP) conversion 400 of a declarative statement 406 to an interrogative statement 418. The system decomposes the speech signal (the selected speech units in declarative form) 406 into residual coefficients 410 and Linear Predictive Coder (LPC) coefficients 412. The RELP technique/algorithm 408 performs the decomposition, and the pitch marks are extracted from the residual signal 410. The pitch template vector 404 is resampled in order to have the same (or close to the same) number of pitch marks as the residual signal 410, with computing of the ratios between the template pitch values and the pitch values for the selected speech units for every adjacent pitch mark. Once aligned, the pitch values are scaled 402 so the pitch values associated with the residual signal 410 is scaled/modified according to the pitch template vector 404. The resulting, modified, residual signal 414 is re-sampled using the vector of ratio factors, then the signal is "reconstructed" via the RELP algorithm 416 using the LPC coefficients. The resulting output is an interrogative speech output 418. Because RELP can affect higher pitch values (toward the end of question formats) by affecting the length of speech output, and therefore the local speech rate, compensation can be provided by resampling the speech and maintaining the duration of the output speech 418 more or less equal to the duration of the input speech 406.

Figure 5:
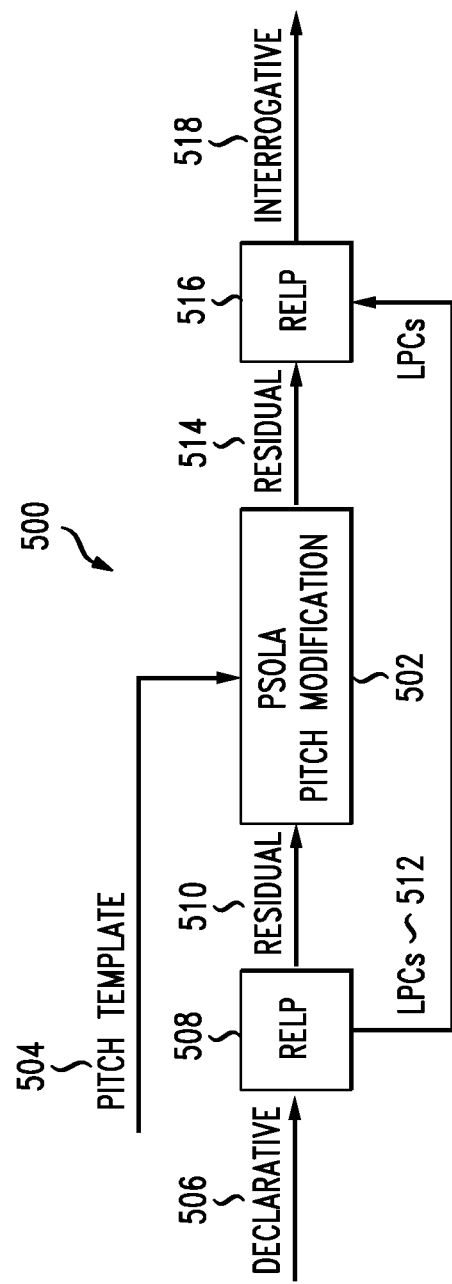
FIG. 5 illustrates a RELP and PSOLA conversion.

FIG. 5 illustrates a RELP and PSOLA conversion 500, combining the techniques described above in FIG. 3 and FIG. 4. In the combined approach, instead of applying PSOLA to the selected speech units using the template pitch contour 504, the system decomposes the speech signal units 506 into residual 510 and LPC coefficients 512 using RELP 508. PSOLA pitch modification 502 is then run on the residual coefficients 510, modifying them based on the pitch template 504. RELP 516 is used again, this time for reconstruction of the signal using the modified residual signal 514 and the original LPC coefficients 512. The advantage of this approach is pitch modification of the residual signal is achieved using a more sophisticated algorithm (PSOLA 502) rather than a simple resampling technique. Also, the number of pitch marks in the pitch template does not necessarily need to be equal to the number of pitch marks in the original residual 510 and modified residual 514 signals. For example, if the PSOLA 502 repeats a frame, a corresponding LPC coefficient can be used. Similarly, if the PSOLA 502 drops a frame, the LPC coefficients for that frame will be ignored. Another advantage of this approach is that since PSOLA 502 is only used to modify the residual signal 510, the amount of distortion introduced to the final interrogative form output 518 is potentially less than the PSOLA-only based approach illustrated in FIG. 3.

While RELP and PSOLA are used to describe speech processing algorithms, it is noted that other speech processing algorithms can be used in similar fashion without detracting from the disclosure. In addition, the algorithms described are relatively sensitive to the segmental time alignment accuracy of the database from which the selected speech units are drawn. The phoneme boundaries for the source and target data are a result of running forced alignment recognition on the speech data and are relatively (but not completely) accurate. Boundaries that are inaccurate have the potential to affect the quality of the imposed pitch curves. In practice, while this is a concern and should be monitored, does not seem to strongly impact speech synthesis quality. Where larger portions of a database are being selected and/or diagnosed it could have a larger impact. Also, voiced and unvoiced data are treated differently in terms of pitch marks, and therefore accurate matching of voice to voice frames and unvoiced data to unvoiced frames in both source speech units and target speech units can require extra monitoring/observation.

Figure 6:
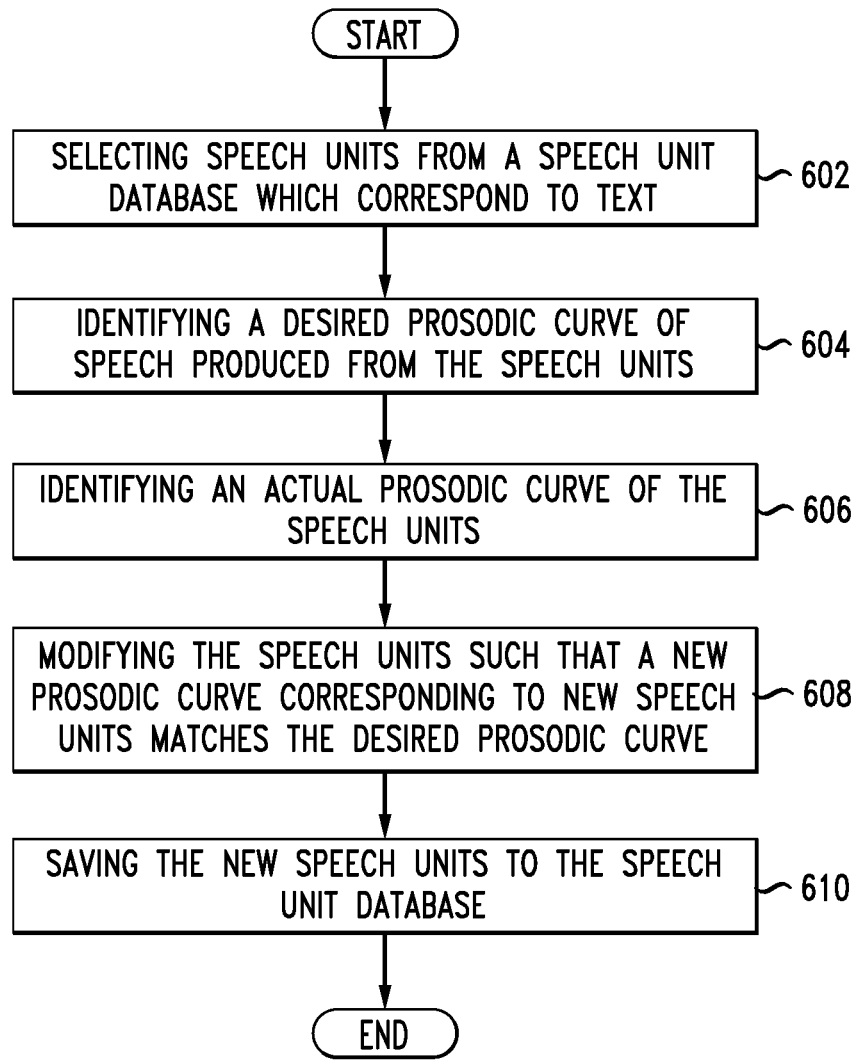
FIG. 6 illustrates an example method embodiment.

Having disclosed some basic system components and concepts, the disclosure now turns to the exemplary method embodiment shown in FIG. 6. For the sake of clarity, the method is described in terms of an exemplary system 100 as shown in FIG. 1 configured to practice the method. The steps outlined herein are exemplary and can be implemented in any combination thereof, including combinations that exclude, add, or modify certain steps.

The system 100 selects speech units from a speech unit database which corresponds to text (602) and identifies a desired prosodic curve of speech to be produced from the speech units (604). The system 100 also identifies the actual prosodic curve of the speech units selected (606). The desired prosodic curve can correspond to a type of intonation, a type of accent, a level of emotion, a type of emotion, a target audience, or other quantifiably distinct prosody. For example, the system 100 can identify an actual intonation of speech units as being a declarative statement when an interrogative intonation is desired. In particular, the type of intonation desired can be an interrogative intonation (such as a yes-no interrogative curve) or a declarative intonation. As another example, the system 100 can identify the accent of the speech units to be a "Southern" accent when a Chicago accent is desired. The system 100 can discover the prosody curve of the selected units corresponds to an angry intonation/emotion, when a calm, excited, happy, sad, and/or other intonation is desired. As yet another example, the system 100 can identify the prosodic curve as corresponding to someone speaking in a "baby voice," and a desired prosodic curve of a normal voice, elderly voice, educated voice, or other voice type.

The system 100 modifies the speech units such that a new prosodic curve corresponding to new speech units matches the desired prosodic curve (608). The modification can be a linear, scaling change of pitch, rate, or speed of the selected speech units, or can use speech processing algorithms such as PSOLA and RELP to modify the speech units. The system 100 saves the new, modified speech units to the speech unit database (610). Such a method extend the database of a speech synthesizer by adding pitch-modified units (based on existing units) to the database. These extra units can then be selected and concatenated like any other speech units in the database to generate synthesized speech, potentially leading to a more natural pitch contour in the synthesized speech. The system 100, in determining if whether to modify speech units or request the new, modified speech units from the database, can perform a cost analysis weighing the cost of modifying speech units versus retrieving the saved speech units from the database. The cost can, for example, be based on how much processing time/power it a specific function will require. For example, an additional step in the illustrated method could be generating speech using the modified speech units by accessing the modified database and/or retrieving the modified speech units. In instances where the cost of retrieving the speech units is less than the cost of modifying the already selected speech units, the system 100 will retrieve the modified units from the database. Likewise, when the cost of retrieving speech units is more than the cost of modifying speech units, the system 100 can select the more efficient option and modify the speech units. Such calculations can require the system 100, prior to modifying the speech units, to perform a calculation to determine if the cost of modifying the selected speech units is higher than a cost of retrieving the speech units.

Embodiments within the scope of the present disclosure may also include tangible and/or non-transitory computer-readable storage devices for carrying or having computer-executable instructions or data structures stored thereon. Such tangible computer-readable storage devices can be any available device that can be accessed by a general purpose or special purpose computer, including the functional design of any special purpose processor as described above. By way of example, and not limitation, such tangible computer-readable devices can include RAM, ROM, EEPROM, CD-ROM or other optical disk storage, magnetic disk storage or other magnetic storage devices, or any other device which can be used to carry or store desired program code in the form of computer-executable instructions, data structures, or processor chip design. When information or instructions are provided via a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hard-wired links, wireless links, or by a combination thereof) through a communications network. In a distributed computing environment, program modules may be located in both local and remote memory storage devices.

The various embodiments described above are provided by way of illustration only and should not be construed to limit the scope of the disclosure. For example, the principles herein apply when modifying/analyzing a single set of selected speech units or when modifying/analyzing multiple selected speech unit sets simultaneously. Various modifications and changes may be made to the principles described herein without following the example embodiments and applications illustrated and described herein, and without departing from the spirit and scope of the disclosure. Claim language reciting "at least one of" a set indicates that one member of the set or multiple members of the set satisfy the claim.

We claim:

1. A method comprising:
   receiving new speech units from a speech unit database; and
   generating speech based on the new speech units, wherein the new speech units were generated by steps comprising:
      determining a cost of modifying residual coefficients, the residual coefficients generated by decomposing speech units, to yield a determination; and
      modifying, via a pitch synchronous overlap and add algorithm and based on the determination, the residual coefficients, to yield modified residual coefficients, wherein the new speech units are produced based on the modified residual coefficients.

2. The method of claim 1, wherein the new speech units were generated by a step further comprising:
   combining, via a residual-excited linear prediction algorithm, the modified residual coefficients with linear predictive coder coefficients, to yield the new speech units, such that a new prosodic curve corresponding to the new speech units conforms to a desired prosodic curve.

3. The method of claim 1, wherein the new speech units were generated by a step further comprising:
   selecting, via a processor, the speech units from the speech unit database.

4. The method of claim 1, wherein the new speech units were generated by a step further comprising:
   identifying an actual prosodic curve of the speech units.

5. The method of claim 2, wherein the desired prosodic curve corresponds to a type of intonation.

6. The method of claim 5, wherein the type of intonation is a declarative intonation or a yes-no interrogative.

7. The method of claim 1, wherein the modifying of the residual coefficients comprises scaling a pitch of the residual coefficients.

8. The method of claim 1, wherein the cost of the modifying of the residual coefficients is higher than a cost of retrieving the new speech units from the speech unit database.

9. A system comprising:

a processor; and a computer-readable storage medium having instructions stored which, when executed by the processor, cause the processor to perform operations, the operations comprising:

receiving new speech units from a speech unit database; and generating speech based on the new speech units, wherein the new speech units were generated by steps comprising:

determining a cost of modifying residual coefficients, the residual coefficients generated by decomposing speech units, to yield a determination; and modifying, via a pitch synchronous overlap and add algorithm and based on the determination, the residual coefficients, to yield modified residual coefficients, wherein the new speech units are produced based on the modified residual coefficients.

10. The system of claim 9, wherein the new speech units were generated by a step further comprising:

combining, via a residual-excited linear prediction algorithm, the modified residual coefficients with linear predictive coder coefficients, to yield the new speech units, such that a new prosodic curve corresponding to the new speech units conforms to a desired prosodic curve.

11. The system of claim 9, wherein the new speech units were generated by a step further comprising:

selecting the speech units from the speech unit database.

12. The system of claim 9, wherein the new speech units were generated by a step further comprising:

identifying an actual prosodic curve of the speech units.

13. The system of claim 10, wherein the desired prosodic curve corresponds to a type of intonation.

14. The system of claim 13, wherein the type of intonation is a declarative intonation or a yes-no interrogative.

15. The system of claim 9, wherein the modifying of the residual coefficients comprises scaling a pitch of the residual coefficients.

16. The system of claim 9, wherein the cost of the modifying of the residual coefficients is higher than a cost of retrieving the new speech units from the speech unit database.

17. A non-transitory computer-readable storage device having instructions stored which, when executed by a computing device, cause the computing device to perform operations, the operations comprising:

receiving new speech units from a speech unit database; and generating speech based on the new speech units, wherein the new speech units were generated by steps comprising:

determining a cost of modifying residual coefficients, the residual coefficients generated by decomposing speech units, to yield a determination; and modifying, via a pitch synchronous overlap and add algorithm and based on the determination, the residual coefficients, to yield modified residual coefficients, wherein the new speech units are produced based on the modified residual coefficients.

18. The non-transitory computer-readable storage device of claim 17, wherein the new speech units were generated by a step further comprising:

combining, via a residual-excited linear prediction algorithm, the modified residual coefficients with linear predictive coder coefficients, to yield the new speech units, such that a new prosodic curve corresponding to the new speech units conforms to a desired prosodic curve.

19. The non-transitory computer-readable storage device of claim 17, wherein the new speech units were generated by a step further comprising:

selecting the speech units from the speech unit database.

20. The non-transitory computer-readable storage device of claim 17, wherein the new speech units were generated by a step further comprising:

identifying an actual prosodic curve of the speech units.

\* \* \* \* \*